(12) United States Patent
Liebau et al.

(10) Patent No.: US 8,216,639 B2
(45) Date of Patent: Jul. 10, 2012

(54) METHODS FOR ELIMINATION OR REDUCTION OF OXIDE AND/OR SOOT DEPOSITION IN CARBON CONTAINING LAYERS

(75) Inventors: Maik Liebau, Dresden (DE); Franz Kreupl, München (DE); Georg Duesberg, Dresden (DE); Eugen Unger, Augsburg (DE)

(73) Assignee: Qimonda AG, Munich (DE)

( * ) Notice: Subject to any disclaimer, the term of this patent is extended or adjusted under 35 U.S.C. 154(b) by 1728 days.

(21) Appl. No.: 11/303,639

(22) Filed: Dec. 16, 2005

(65) Prior Publication Data

US 2007/0141256 A1    Jun. 21, 2007

(51) Int. Cl.
*C23C 16/00* (2006.01)
(52) U.S. Cl. ............ 427/248.1; 427/255.23; 427/255.28
(58) Field of Classification Search ............... 427/248.1, 427/249.1, 249.5, 249.6, 249.7, 249.8, 249.15, 427/249.17, 255.23, 255.28, 255.6, 255.7
See application file for complete search history.

(56) References Cited

U.S. PATENT DOCUMENTS

| | | | | |
|---|---|---|---|---|
| 3,361,638 | A | * | 1/1968 | Bokros et. al. ............... 376/411 |
| 3,692,565 | A | * | 9/1972 | Lersmacher et al. ......... 427/228 |
| 4,262,039 | A | * | 4/1981 | Gyarmati et al. ............ 427/213 |
| 4,434,188 | A | | 2/1984 | Kamo et al. |
| 5,370,912 | A | | 12/1994 | Bigelow et al. |
| 5,496,596 | A | | 3/1996 | Herb et al. |
| 5,955,155 | A | | 9/1999 | Yamamoto et al. |
| 6,235,645 | B1 | * | 5/2001 | Habuka et al. ................ 438/758 |
| 2005/0260411 | A1 | | 11/2005 | Ravi |

FOREIGN PATENT DOCUMENTS

| | | |
|---|---|---|
| DE | 19856295 C2 | 6/2002 |
| DE | 10345393 A1 | 5/2005 |
| DE | 102004006544 B3 | 9/2005 |

OTHER PUBLICATIONS

G. Raghavan, "Polycrystalline Carbon: A Novel Material for Gate Electrodes in MOS Technology," Jpn. J. Appl. Phys. vol. 32, pp. 380-383, Jun. 1993.
A. Bergmaier, "Oxygen at the interface of CVD diamond films on silicon," Diamond and Related Materials, vol. 8, pp. 1142-1147, 1999.
Agnes Oberlin, "Review Pyrocarbons", Carbon, vol. 40, pp. 7-24, 2002.

* cited by examiner

*Primary Examiner* — Michael Cleveland
*Assistant Examiner* — Michael G Miller

(57) ABSTRACT

One embodiment of the present invention provides a method for the deposition of a Carbon containing layer on a Silicon surface wherein a (i) substantially Silicon-oxide-free or reduced oxide interface results between Silicon and the Carbon containing layer during the deposition. In another embodiment, the present invention provides a method for deposition of a Carbon containing layer wherein the deposition process is substantially soot (particle)-free or reduction of soot.

20 Claims, 8 Drawing Sheets

METHODS FOR ELIMINATION OR REDUCTION OF OXIDE AND/OR SOOT DEPOSITION IN CARBON CONTAINING LAYERS

TECHNICAL FIELD

The invention, according to one embodiment, relates to a method for the deposition of a carbon containing layer on a surface, e.g., a silicon surface, that may result in (i) a substantially silicon-oxide-free interface between silicon and carbon containing layer during the deposition, or (ii) reduction of oxide deposition at the interface between the silicon and carbon containing layer.

According to another embodiment, the present invention relates to a method for deposition of a carbon containing layer wherein the deposition process is (i) substantially soot (particle)-free, or (ii) reduces the amount of soot deposition.

BACKGROUND

During the manufacturing of conductive structures in a semi-conductor device, like trenches, electrodes or vias, it usually is important to use a highly conductive layer which adheres well on the surface of a substrate like silicon. Furthermore, the choice of such material should as well satisfy some criteria as discussed below.

On one hand, the formation and further processing of the material should be compatible with standard semiconductor manufacturing processes. In addition, a conform layer is usually required, e.g., a layer should be formed uniform across a wafer and reproducible from wafer to wafer. Furthermore, the manufacturing process should be easy to implement and most importantly, cost attractive in comparison to standard procedures.

It is well known from the literature that conductive carbon containing materials, like polycrystalline carbon containing films known also as pyrocarbon, can be excellent candidates for semiconductor technology, e.g., for the fabrication of memory devices such as DRAM or Non-Volatile Memories (NVM).

The patent DE 103 45 393 A1 describes a method to deposit conductive carbon containing layers on a silicon substrate. The silicon surface is covered with silicon-oxide as a passivation layer. The method consists of introducing a wafer in a chamber at room temperature, to heat the chamber to 950° C. under $H_2$ flow. Then the carbon containing layer is deposited by pyrolyse of $CH_4$ at a pressure of 300 hPa to 800 hPa and at 950° C. Optionally after the deposition, the carbon containing layer may be annealed at a temperature of 1050° C. for 2 minutes.

The patent DE 10 2004 006 544 B3 describes a method of manufacturing MESFET transistors (Metal Semiconductor Field Effect Transistor) with a Schottky-gate consisted of a conductive carbon containing material.

G. Raghavan et al. describe in reference Jpn. J. Appl. Phys. Vol. 32(1993) pp. 380-383, the use of polycrystalline Carbon (in the reference it is named as well polycarbon) as a material for gate electrodes in MOS technology. The polycarbon films are deposited on oxidized silicon substrates at temperatures ranging from 700° C. to 1100° C. and at pressures ranging from 0.5 Torr to 2.0 Torr (~66.7 Pa to 266.7 Pa). Oxide thicknesses are varied from 6.2 nm to 100 nm. Methane is used as the hydrocarbon precursor and boron trichloride is used to dope the polycarbon films. The technique of deposition consists of Plasma Assisted Chemical Vapour Deposition (PECVD) with an RF (Radio-Frequency) excitation at 13.56 MHz.

The patent DE 198 56 295 C2 describes a method of manufacturing Chemically Sensitive Field Effect Transistors (CHEMFET) wherein the gate electrode is a so called carbon-electrode. The carbon-electrode is formed of a carbon containing layer which is an organic (Novolack) material. The gate electrode is built on a silicon-oxide layer which is used as isolation layer on top of a silicon substrate.

Although conductive carbon films could be very attractive materials for semiconductor manufacturing, the application of these materials is up to now limited. In particular, there is a limitation for their application in trench capacitors (as for example MIM-like (Metal-Insulator-Metal) capacitor structures) or as Schottky diodes where at least one metal layer is formed by a conductive carbon containing layer on a silicon surface.

One factor limiting the application of carbon containing materials is the formation of a silicon-oxide layer on the surface of silicon substrate. The literature discloses well known wet-chemical treatments based on HF solution, to etch and remove the silicon-oxide native layer from the surface of silicon. However, during the deposition of conductive carbon containing films on a silicon surface, at temperatures between 600° C. and 900° C., the formation of a silicon-oxide interface is unavoidable. This silicon-oxide interface, although thin (less than 2 nm), results in appearance of an additional capacitive resistance which either reduces the performance or deteriorates the functionality of the devices as trench capacitors (like MIM) or Schottky diodes.

Bergmaier et al., in reference Diamond and Related Materials 8(1999) pp. 1142-1147, report the studies of the oxygen coverage at the diamond/Silicon interface, in a range of temperature between 700° C. and 850° C.

A second factor limiting the use of carbon containing materials in devices, as trench capacitors (like MIM) or Schottky diodes, is the formation of side products as particles, in particular polymeric carbon products, from carbon containing gas. Although conform layers could be easily deposited from carbon containing gases, a so-called substantially soot (particle)-free process is a due for semiconductor applications in aim to avoid a yield loss by parasitic particles.

Oberlin reports in reference Carbon 40(2002) pp. 7-24, the micro-structural studies of pyrocarbon films related to the decomposition of hydrocarbon gases and chemical reactions in the gas phase. It was reported in this reference that by using $C_2H_2$ as gas, droplets (homogeneous nucleation in the gas) form parasitic soot which would subsequently deposit on the substrate.

SUMMARY

The present invention, according to one embodiment, provides a solution to reduce the above described problems which highly improves the use of carbon containing materials for semiconductor application.

Accordingly, an object of one embodiment of the present invention is to provide a method for deposition of carbon containing layers on silicon surface where the interface silicon-carbon containing layers is substantially Silicon-oxide-free or the interface has a reduced amount of oxide as compared to heretofore known processes.

A further object of an embodiment of this invention is to provide a deposition method of carbon containing layers which is substantially soot (particle)-free or wherein the amount of soot is reduced.

BRIEF DESCRIPTION OF THE DRAWINGS

Various aspects and advantages of the present invention will be apparent from the following detailed description of the exemplary embodiment of the invention and the accompanying drawings wherein.

The drawings 6a, 6b and 6c are not necessarily to scale. They represent schematically the variation of temperature, gas flow and thickness respectively, as a function of time according to embodiments of the present invention.

DETAILED DESCRIPTION

While specific exemplary embodiments of the invention will now be described in detail for illustrative purposes, it should be understood that the present invention is not limited to the specific embodiments described in the specification. A person skilled in the art can recognize that many widely different embodiments of the present invention may be constructed in a variety of other applications without departing from the spirit and scope of the present invention. Further, it would be apparent to a person skilled in the pertinent art that all values discussed herein are exemplary, as values can vary depending on an application or specification of an application.

Figure 1:
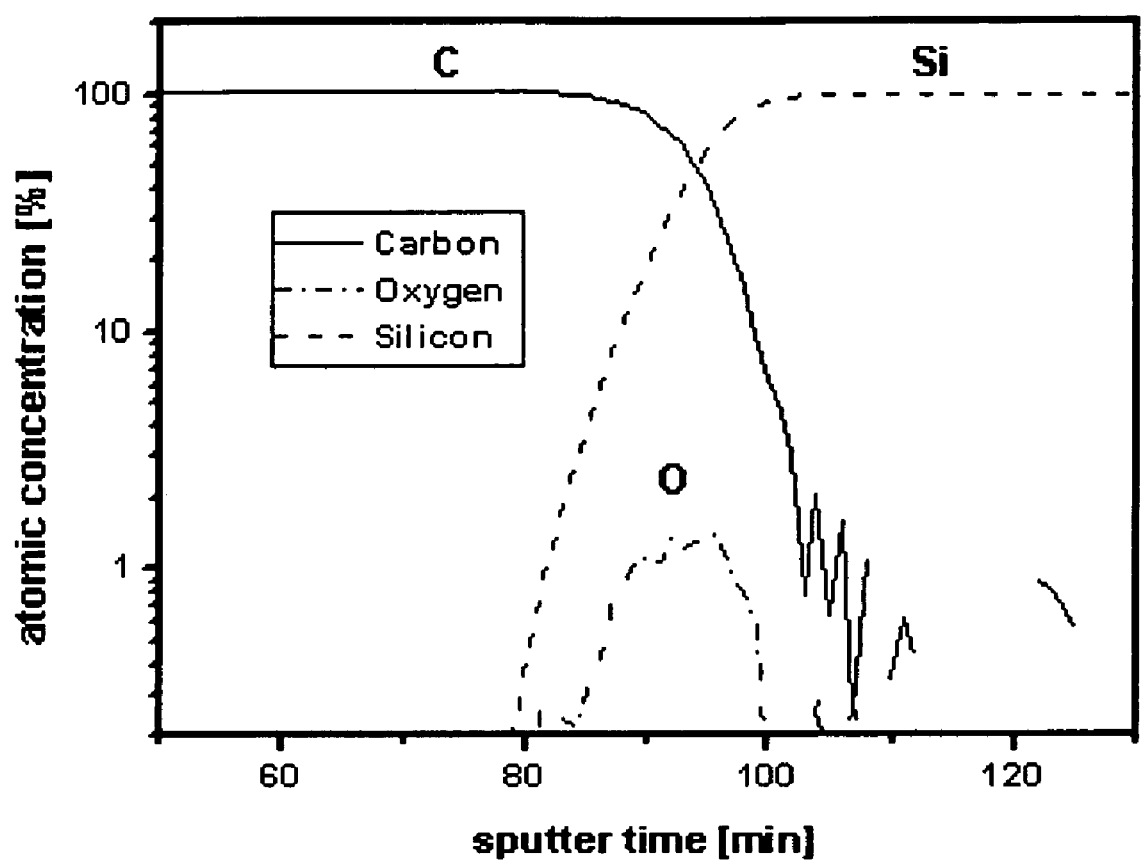
FIG. 1 shows the depth analysis, by means of ESCA (Electron Spectroscopy for Chemical Analysis), on the interface of a system comprising a Carbon containing layer and a Silicon substrate where the Carbon containing layer is deposited on the Silicon surface by means of a well known pyrolitic deposition process.

FIG. 1 illustrates the depth analysis on the interface of a system comprising of a Silicon substrate and a Carbon containing layer deposited on the surface of the Silicon. The depth analysis was obtained by means of ESCA (Electron Spectroscopy for Chemical Analysis) measurements.

The Silicon substrate was treated with a wet-chemical etch process based on a HF solution, before its introduction into the processing chamber, a chamber where said Si substrate is processed. This etch technique allows the elimination of the native Silicon-oxide layer which is present on the surface of a Silicon substrate.

According to the patent DE 103 45 393 A1, after the introduction of the Silicon substrate into the processing chamber, the Silicon substrate is heated up to 950° C. in a $H_2$ atmosphere. A Carbon containing layer is then deposited on the surface of the Silicon by introducing a $CH_4$ gas at a pressure of 330Pa and constant temperature of 950° C.

The depth analysis of this system, as shown on FIG. 1, shows the presence of a well defined Oxygen peak at the interface of Silicon substrate and the Carbon containing layer. The presence of Oxygen is in fact a clear indication of the formation of a thin Silicon-oxide layer at the interface of the Silicon surface and the Carbon containing layer.

Figure 2:
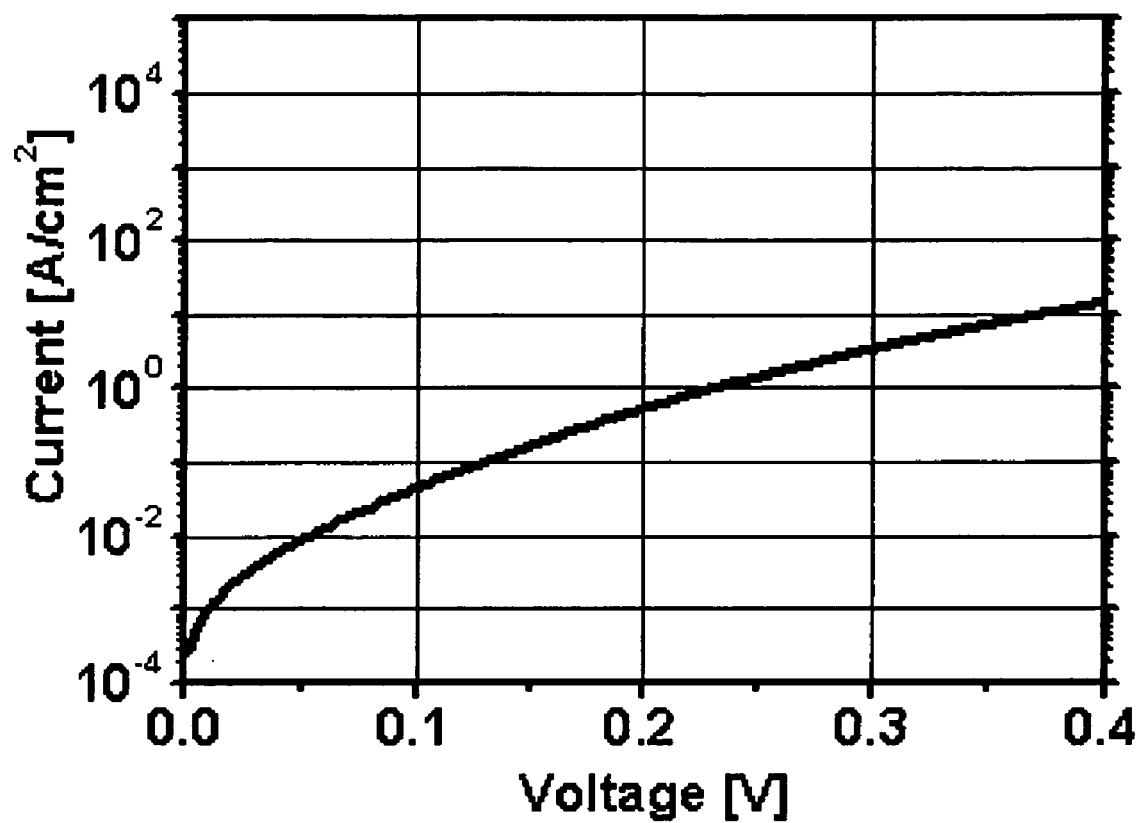
FIG. 2 shows the I (Current)-V (Voltage) analysis of a system comprising a Carbon containing layer and a Silicon substrate where the Carbon containing layer is deposited on the Silicon surface by means of a well known pyrolitic deposition process (deposition method identical to FIG. 1).

FIG. 2 illustrates the I (Current)-V (Voltage) analysis of the system defined as Silicon substrate-Silicon oxide-Carbon containing layer, as described above. Since the reformation of the Silicon oxide takes place during the heat-up before the deposition of the Carbon containing layer, an additional capacitive resistance will appear at the interface Silicon-Carbon containing layer which in turn reduces the capacitance of the device in particular in case of a trench capacitor in DRAM technology where at least one electrode is consisting of a conductive Carbon containing layer and deposited on the surface of a Silicon substrate. Alternatively, the current density, as shown in FIG. 2, is of 0.4 A/cm$^2$ at 0.2 V in a Schottky-diode due to the additional thin oxide layer.

The present invention, according to one embodiment, provides a method of deposition of a Carbon containing layer on a Silicon surface in which the interface of Carbon containing layer and the Silicon substrate is substantially free of Silicon-oxide or wherein there is a reduction of oxide deposited.

According to one embodiment of the present invention, the procedure may comprise a wet-chemical etch process of a Silicon substrate based on a HF solution, before its introduction into the processing chamber to possibly eliminate the native Silicon-oxide layer from the surface of Silicon substrate as described earlier.

After the introduction of the Silicon substrate into a processing chamber at a temperature T1, e.g., room temperature, a first gas G01 may be introduced into the processing chamber under pressure, e.g., atmospheric pressure. The gas G01 could be for example an inert gas like Ar or He or a gas like $H_2$ or $N_2$ or a mixture of these gases. After a purge time, in presence of the Gas G01, for example Ar, a second gas G02 may be introduced, e.g., injected, into the processing chamber under pressure, e.g., atmospheric pressure.

The gas G02 is a Carbon containing gas, e.g., like a Hydrocarbon, such as but not limited to, $C_nH_{2n+2}$ (with n comprising between 1 and 4) or $C_2H_2$ or $C_2H_4$, or a Carbon containing gas, e.g., but not limited to $CCl_4$ or a mixture of these gases. For example, a $C_2H_2$ gas may be introduced into an another gas, e.g., Ar gas, in the processing chamber at a temperature, e.g., room temperature, and at pressure, e.g., atmospheric pressure.

According to one embodiment of the present invention, the ratio of the Gas G01 to gas G02 in the processing chamber, could vary from about 1/100 to a about 20/1. For example, the gas $C_2H_2$ may be injected into processing chamber in presence of Ar where the gas flow ratio of Ar/$C_2H_2$ is 5/1. As noted, other ratios of G01 to G02 may be utilized depending upon the desired results.

The processing chamber may be heated up from temperature T1 to higher temperatures, in the presence of the gas flow (e.g., constant gas flow) ratio G01/G02 (for example Ar/$C_2H_2$ with a flow ratio of 5/1), until the processing chamber achieves a pre-defined temperature T2 (for example, T2 may be 840° C. for Ar/$C_2H_2$ gas flow ratio of 5/1). The temperature T2 may vary from about 700° C. to about 1200° C. depending on the Carbon containing gas G02 utilized. It must be understood that the processing chamber may be heated up entirely in case of hot walls processing chambers or locally by heating up the temperature of the substrate in case of cold walls processing chambers.

According to one embodiment of the invention, during the temperature ramp-up phase of the processing chamber, from, e.g., room temperature to, e.g., about 840° C., in case of Ar/$C_2H_2$ for example with a ratio of flow 5/1, the Carbon containing gas $C_2H_2$ may decompose at temperatures above 305° C. to undefined polymers which may deposit and form a uniform Carbon containing layer over the surface of the Silicon substrate. The thickness of this Carbon containing layer may continue to increase, during this temperature ramp-up phase to about 840° C., until a pre-defined thickness is achieved which could vary, for example, from about 1 nm to about 500 nm.

Figure 3:
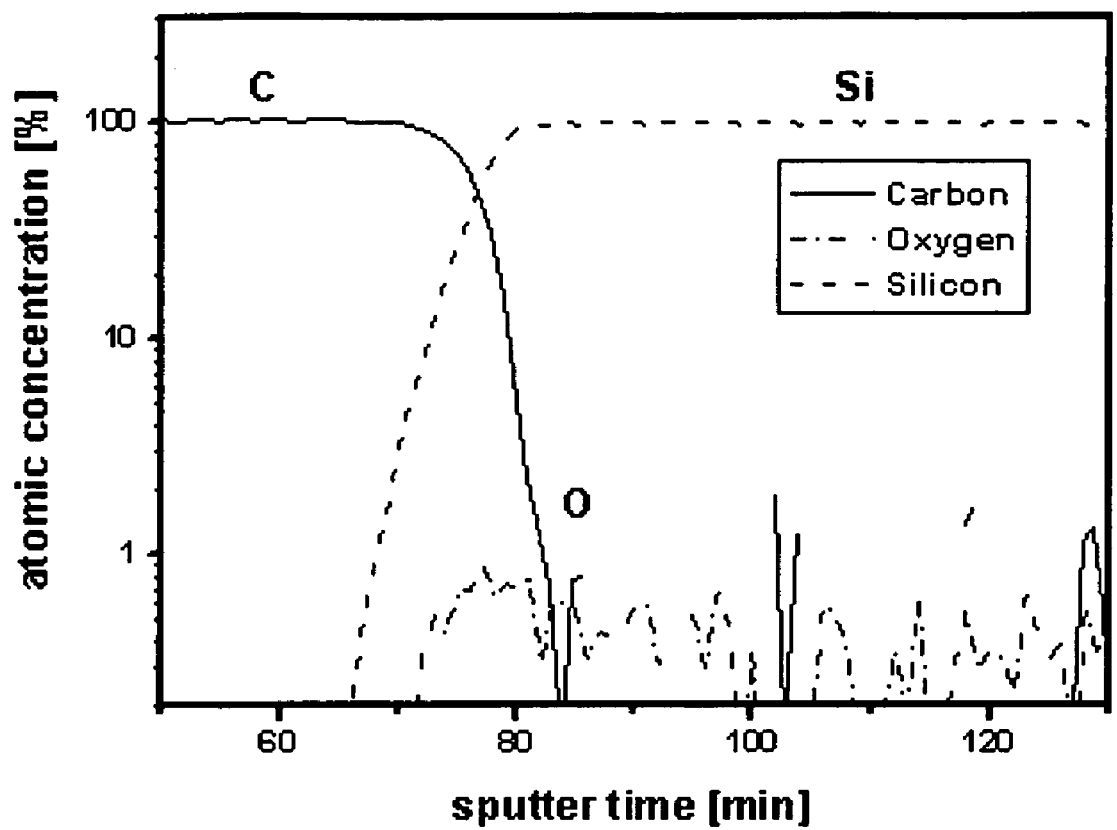
FIG. 3 shows the depth analysis, by means of ESCA, on the interface of a system comprising a Carbon containing layer and a Silicon substrate where the Carbon containing layer is deposited on the Silicon surface by means of an embodiment of the present invention.

FIG. 3 illustrates the depth analysis on the interface of a system comprising of a Silicon substrate and the Carbon containing layer deposited on the surface of the Silicon according to the deposition process steps described above. As mentioned earlier, the depth analysis was obtained by means of ESCA measurements.

As shown on FIG. 3, the amount of oxygen may be significantly reduced at the interface of Silicon substrate and the Carbon containing layer deposited according to an embodiment of the present invention. Therefore, one may consider that the interface of Silicon-Carbon containing layer is substantially Silicon-oxide free or at a minimum the interface contains a reduced amount of oxide. It should be understood that the term "interface substantially Silicon-oxide free" means that the amount of oxygen is so low at the interface Silicon-Carbon containing layer that a well defined peak for oxygen cannot be obtained during ESCA measurements (the amount of oxygen, in this case, is under the resolution limits of ESCA technique). On FIG. 3, the oxygen signal is only present as a background/noise signal, in contrast to FIG. 1.

Figure 4:
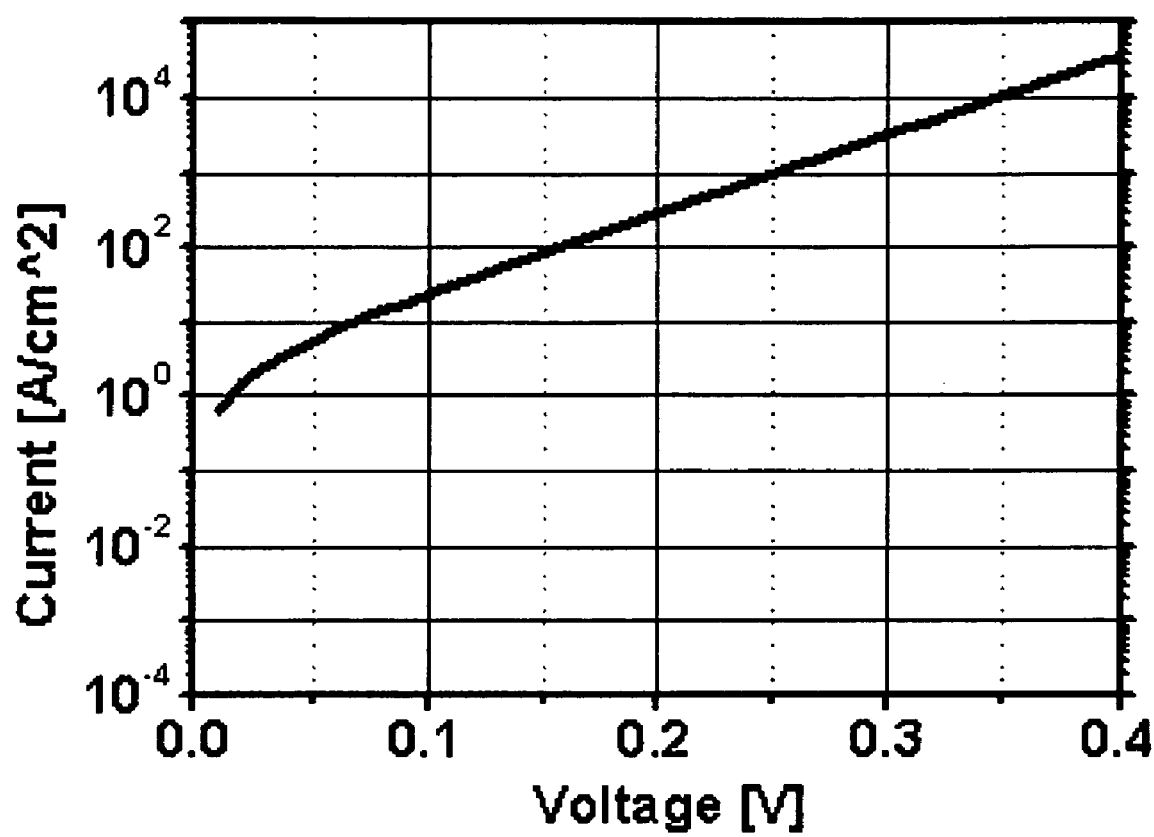
FIG. 4 shows the I-V analysis of a system comprising a Carbon containing layer and a Silicon substrate where the Carbon containing layer is deposited on the Silicon surface by means of an embodiment of the present invention (deposition method identical to FIG. 3).

FIG. 4 illustrates the I-V analysis of the system defined as Silicon substrate-Carbon containing layer, deposited according to an embodiment of the present invention. A comparison of FIGS. 2 and 4 shows that the deposition of a Carbon containing layer on a Silicon surface with interface substantially Silicon-oxide free, according to an embodiment of the present invention, improves the performance of the device. The significant reduction of the amount of Silicon oxide at the interface Silicon-Carbon containing layer may enable a direct contact of Silicon-Carbon containing layer without an additional capacitance (or significant additional capacitance) due to a Silicon oxide interface, as shown in FIG. 4. At 0.2 V, the current density, according to one embodiment of the invention, may be increased to about 3000 A/cm², in contrast to FIG. 2 where a current density of about 4 A/cm² was obtained.

According to another embodiment of the present invention, there is provided a method of deposition of a Carbon containing layer for which the deposition process is substantially soot (particle)-free or having a reduced amount of soot.

Figure 5:
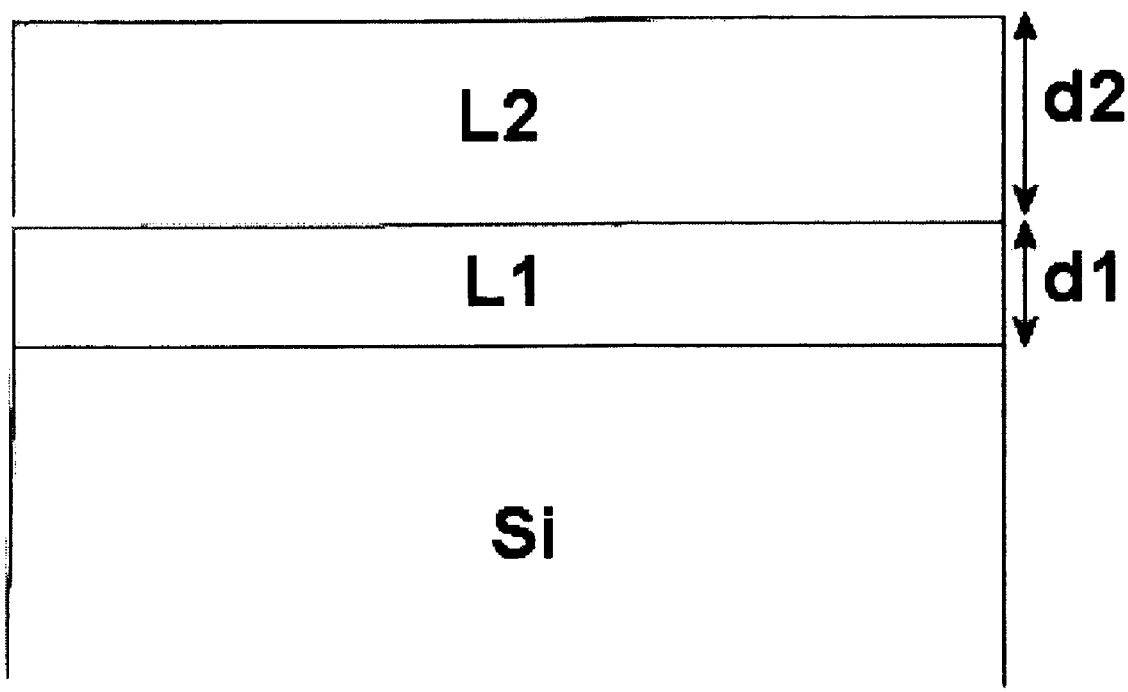
FIG. 5 shows the schematic of a system consisting of a conductive Carbon containing layer L2, a Carbon containing layer L1 and a Silicon substrate where the Carbon containing layer L2 is deposited on the Carbon containing layer L1 and the Carbon containing layer L1 is deposited on the Silicon surface according an embodiment of the present invention.

During the method of fabrication of the system of FIG. 5, consisting of a Silicon substrate and a first Carbon containing layer and a second Carbon containing layer, in the detailed embodiment of the present invention and on the figures the following designation signs are used which refer to:

| L1    | First Carbon containing layer deposited on the Silicon surface; |
| L2    | Second Carbon containing layer deposited on the first Carbon containing layer L1; |
| d1    | Thickness of Carbon containing layer L1; |
| d2    | Thickness of Carbon containing layer L2; |
| G01   | Gas supply 1; |
| G02   | Gas supply 2; |
| T1-T4 | Temperatures 1 to 4; and |
| t1    | Annealing time. |

FIG. 5 illustrates schematically, according to one embodiment of the invention, a system consisting of a Silicon substrate, a first Carbon containing layer L1 and a second Carbon containing layer L2. It should be understood from this schematic that the first Carbon containing layer L1 may be deposited on the Silicon surface wherein the interface of Silicon substrate and Carbon containing layer L1 is substantially Silicon oxide free.

Referring to FIG. 5, the second Carbon containing layer L2 may be deposited, according to another embodiment of the present invention, wherein the Carbon containing material L2 is substantially soot (particle)-free.

Figure 6A:
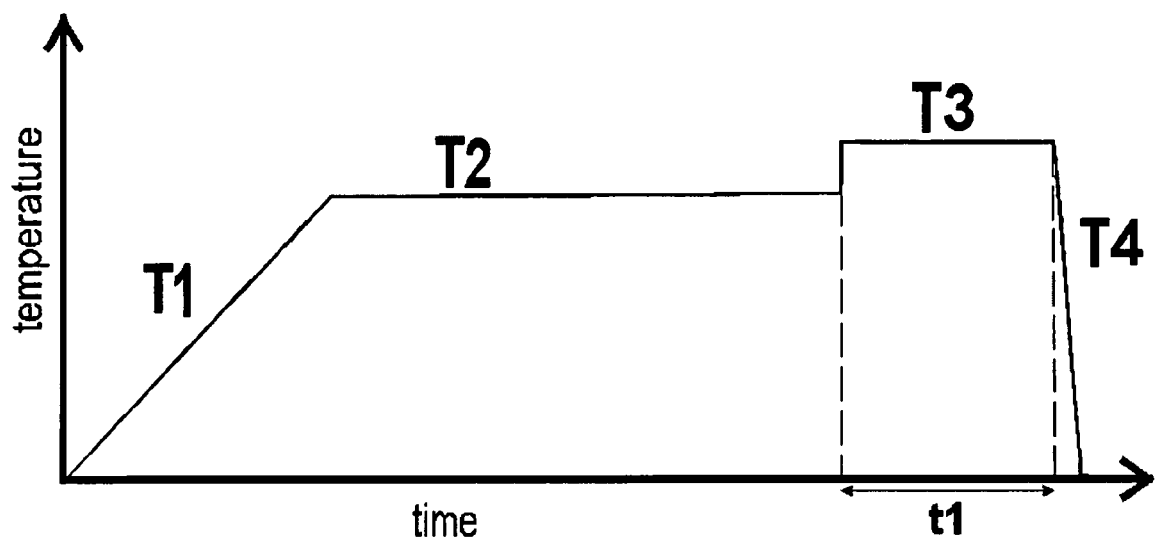
FIG. 6a shows, for an embodiment of the present invention, the variation of temperature as a function of time during the deposition process.
Figure 6B:
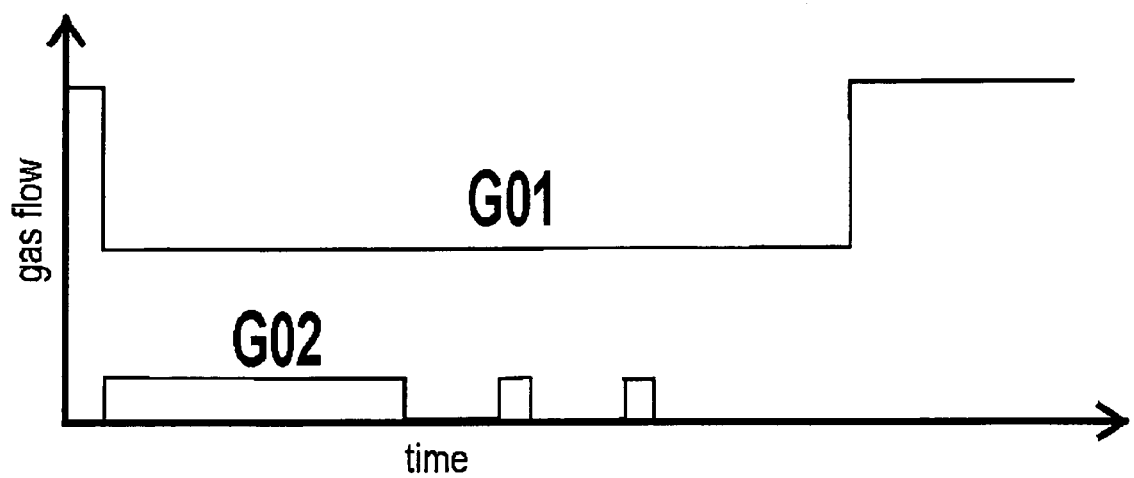
FIG. 6b shows, for an embodiment of the present invention, the variation of gas flows G01 & G02 as a function of time during the deposition process.
Figure 6C:
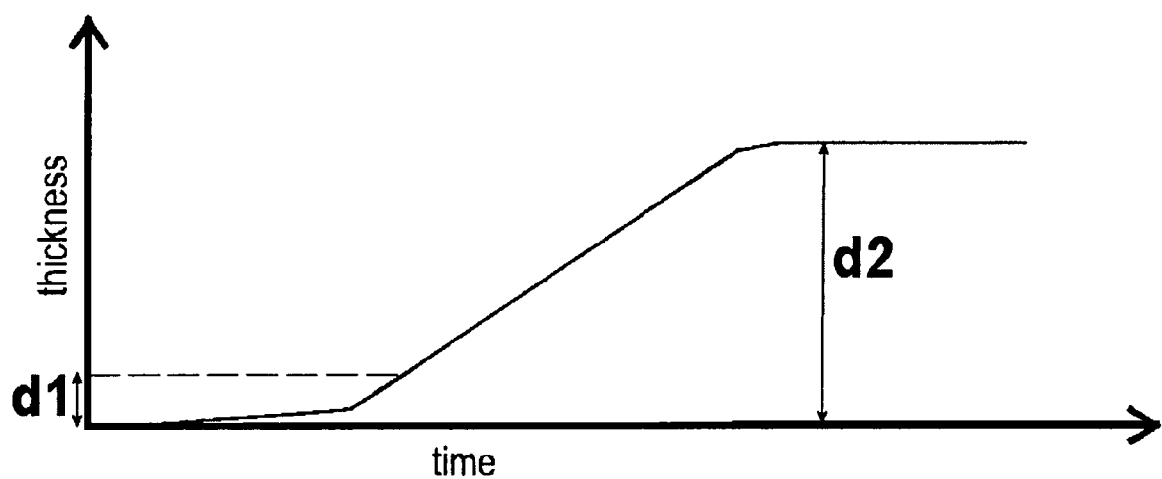
FIG. 6c shows, for an embodiment of the present invention, the variation of thicknesses d1 and d2 of Carbon containing layers L1 and L2 respectively, as a function of time of process.

According to an embodiment of the invention, FIGS. 6a and 6b show respectively examples of the variation of temperature and the gas flows G01 and G02, in the processing chamber and FIG. 6c, according to another embodiment of the invention, shows schematically examples of the variation of thicknesses d1 and d2 of Carbon containing materials L1 and L2 respectively, during the fabrication of the system illustrated in FIG. 5.

According to an embodiment of the invention, a method of fabrication for a system of Carbon containing layers L1 & L2 on a Silicon substrate surface, as shown, e.g., in FIG. 5, may comprise the following:

First, a Silicon substrate, before its introduction into the processing chamber, may be treated by means of a wet-chemical etch process based on a HF solution in order to help eliminate the native Silicon-oxide layer from the surface of Silicon substrate.

After the introduction of the Silicon substrate into a processing chamber at a temperature T1, e.g., room temperature, a first gas G01 may be introduced into the processing chamber under pressure, e.g., atmospheric pressure. The gas G01 may, for example, be an inert gas like Ar or He or a gas like $H_2$ or $N_2$ or a mixture of these gases. After a purge time, in presence of the Gas G01, for example Ar, a second gas G02 may be introduces, e.g., may be injected into the processing chamber under pressure, e.g., atmospheric pressure.

The gas G02 may comprise a Carbon containing gas like a Hydrocarbon, e.g., but not limited to, $C_nH_{2n+2}$ (with n comprising between 1 and 4) or $C_2H_2$ or $C_2H_4$, or a Carbon containing gas like $CCl_4$ or a mixture of these gases. For example, a $C_2H_2$ gas may be introduced into an Ar gas in the processing chamber at a temperature, e.g., room temperature and at a pressure, e.g., atmospheric pressure.

The ratio of the Gas G01 to gas G02, in the processing chamber, may vary from about 1/100 to a about 20/1. For example, the gas $C_2H_2$ may be injected into processing chamber in presence of Ar where the gas flow ratio of Ar/$C_2H_2$ may be about 5/1.

The processing chamber may be heated up from temperature T1 to higher temperatures, in the presence of the a gas flow ratio G01/G02 which may be constant(for example, Ar/C$_2$H$_2$ with a flow ratio of about 5/1), until the processing chamber achieves a pre-defined temperature T2 (for example, T2 may be about 840° C. for Ar/C$_2$H$_2$ gas flow ratio of about 5/1), as shown on FIGS. 6a and 6b. The temperature T2 may vary from about 700° C. to about 1200° C. depending on the Carbon containing gas G02 utilized. It should be understood that the processing chamber may be heated up entirely in case of hot walls processing chambers or locally by heating up the temperature of the substrate in case of cold walls processing chambers.

According to one embodiment of the invention, during a temperature ramp-up phase of the processing chamber, from T1 to T2 (for example, room temperature to about 840° C., in case of Ar/C$_2$H$_2$ for example with a ratio of about flow 5/1) the Carbon containing gas decomposes at temperatures above about 300° C. (for example, about 305° C. in case of C$_2$H$_2$) and forms a Carbon containing layer L1 on the surface of Silicon substrate and thus prevent the formation of Silicon oxide on the surface of Silicon substrate. The thickness of the deposited Carbon containing layer L1 may continue to increase, during this temperature ramp-up phase to T2 (for example, about 840° C.), until a pre-defined thickness d1 is achieved, as shown on FIG. 6c, which may vary, for example, from about 1 nm to about 500 nm.

At a constant temperature T2 (for example, about 840° C.), the Carbon containing gas G02 may be added into the processing chamber in form of short pulses (for example, about 10 sec of C$_2$H$_2$ with a gas flow of 1 slm (standard liter/min.), in presence of the gas G01 as shown on FIG. 6b (for example, with a gas flow ratio of about 5/1 for Ar/C$_2$H$_2$), to form a second Carbon containing layer L2 on the surface of the Carbon containing layer L1 (as shown on FIG. 5).

The duration of Carbon containing gas pulses (for example, about 10 sec) may be dependant on the chamber size and the mass flow systems utilized. The pulses are separated from each other by a time-frame which may be dependant on the purge time of the Carbon containing gas G02 from the processing chamber.

The Carbon containing gas pulses may be repeated until a pre-defined thickness d2 of the Carbon containing layer L2 is achieved, as shown on FIG. 6c, which may be, for example, approximately in a range of about 1 nm to about 10 mm.

According to one embodiment of the present invention, after the deposition of the Carbon containing layer L2 with a desired thickness d2, the processing chamber may be purged from the Carbon containing gas G02, in presence of the gas G01 as shown, e.g., in FIG. 6b. Still in presence of the gas G01, the temperature of the processing chamber may be increased from T2 to a desired temperature T3 (for example, about 950° C.), as shown in FIG. 6a. The temperature T3 may vary from about 850° C. to about 1500° C. depending on the annealing technique (spike-or flash-or laser-anneal technique) utilized.

According to one embodiment of the invention, at a constant temperature T3 and in the presence of gas G01, the system of, e.g., FIG. 5 consisting of Silicon substrate, Carbon containing layer L1 and the Carbon containing layer L2 is annealed (for example, for about 2 minutes). The annealing time t1 (varying approximately from about 0.5 minute to about 5 minutes) may depend on the electrical properties of the Carbon containing layer L2 to be achieved (desired conductivity values varying approximately between 60 μohmcm to 2 μohmcm based on the application of the Carbon containing material in semiconductor technology, in particular for memory devices).

After annealing step, according to one embodiment of the invention, the processing chamber may be purged from the gas G01 and the temperature of the processing chamber may be decreased from T3 to a desired temperature T4. The temperature T4 may vary from about 20° C. to about 400° C. It must be understood that the temperature of processing chamber may be decreased entirely in case of hot walls processing chambers or locally by decreasing the temperature of the substrate in case of cold walls processing chambers. At a temperature T4, according to one embodiment of the invention generally shown by the system of FIG. 5, consisting of the Silicon substrate and the Carbon containing layer L1 and the Carbon containing layer L2, may be removed from the processing chamber.

Finally, according to some embodiments of the invention, the processing chamber may be cleaned by means of a MW (Micro-Wave) oxygen plasma or by purging the processing chamber with ozone gas or by heating the processing chamber under oxygen flow or by a combination of these techniques.

We claim:

1. A method for depositing a layer containing Carbon on a Si substrate, said method comprising:
    a) removing a Silicon-oxide layer from the surface of the Si substrate,
    b) placing said Si substrate in a chamber for processing at a first temperature T1, and
    c) increasing said temperature T1 to a second temperature T2, wherein during said temperature increase, at least a first gas G01 and a second gas G02 containing at least Carbon are introduced into the chamber, and a layer containing Carbon is deposited at atmospheric pressure.

2. A method according to claim 1, wherein said temperature T1 is approximately room temperature.

3. A method according to claim 1, wherein said temperature T2 is approximately in the range of 700° C. to 1200° C.

4. A method according to claim 1, wherein said gas G01 is selected from the group of gases consisting of Ar, He, H$_2$, N$_2$ and combinations thereof.

5. A method according to claim 1, wherein said gas G02 contains at least one Carbon element.

6. A method according to claim 5, wherein said gas G02 is selected from the group of gases consisting of C$_n$H$_{2n+2}$ wherein n is between 1 and 4, C$_2$H$_2$, C$_2$H$_4$, CCl$_4$, and combinations thereof.

7. A method according to claim 1, wherein the flow ratio of said gas G01 to said gas G02 is approximately in the range of 1/100 to 20/1.

8. A method according to claim 1, wherein the thickness of said layer containing Carbon is approximately in the range of 1 nm to 500 nm.

9. A method for depositing a system of layers containing Carbon on a Si substrate, said method comprising:
    a) removing a Silicon-oxide layer from the surface of the Si substrate,
    b) placing said Si substrate in a chamber for processing at a first temperature T1,
    c) increasing said temperature T1 to a second temperature T2,
    d) during said temperature increase, introducing into said chamber at least a first gas G01 and a second gas G02 containing at least Carbon and depositing, at atmospheric pressure, a first layer L1 containing Carbon until a pre-defined thickness d1 is achieved,
    e) switching off the flow of said gas G02 while said gas G01 continues to flow into said chamber at said Temperature T2 and at atmospheric pressure, f) continuing to introduce said gas G01 in said chamber and introducing said gas G02 as a pulse during a pre-determined pulse-time and depositing, at atmospheric pressure, a second layer L2 containing Carbon, g) repeating the steps e and f until a predefined thickness d2 of said layer L2 is achieved, h) switching off the flow of said gas G02 while said gas G01 continues to flow into aid chamber at said Temperature T2 and at atmospheric pressure, i) increasing said temperature T2 to a third temperature T3, j) annealing said layer L2 at said temperature T3 for a pre-defined time t1, k) under said gas G01, decreasing said temperature T3 to a fourth temperature T4, l) switching off the flow of said gas G01, and m) removing said system of layers containing Carbon on a Si substrate from said chamber.

10. A method according to claim 9, wherein said temperature T1 is approximately room temperature.

11. A method according to claim 9, wherein said temperature T2 is approximately in the range of 700° C. to 1200° C.

12. A method according to claim 9, wherein said gas G01 is selected from the group of gases consisting of Ar, He, $H_2$, $N_2$ and combinations thereof.

13. A method according to claim 9, wherein said gas G02 contains at least one Carbon element.

14. A method according to claim 13, wherein said gas G02 is selected from the group consisting of $C_nH_{2n+2}$ with n between 1 and 4, $C_2H_2$, $C_2H_4$, $CCl_4$, and combinations thereof.

15. A method according to claim 9, wherein the flow ratio of said gas G01 to said gas G02 is approximately in the range of 1/100 to 20/1.

16. A method according to claim 9, wherein the thickness d1 of said layer L1 is approximately in the range of 1 nm to 500 nm.

17. A method according to claim 9, wherein the thickness d2 of said layer L2 is approximately in the range of 1 nm to 10 mm.

18. A method according to claim 9, wherein said temperature T3 is approximately in the range of 850° C. to 1500° C.

19. A method according to claim 9, wherein said time t1 is approximately in the range of 0.5 minute to 5 minutes.

20. A method according to claim 9, wherein said temperature T4 is approximately in the range of 20° C. to 400° C.

* * * * *